US012540419B2

(12) United States Patent
Suo et al.

(10) Patent No.: US 12,540,419 B2
(45) Date of Patent: *Feb. 3, 2026

(54) SiC EPITAXIAL WAFER

(71) Applicant: Resonac Corporation, Tokyo (JP)

(72) Inventors: Hiromasa Suo, Tokyo (JP); Rimpei Kindaichi, Tokyo (JP); Tamotsu Yamashita, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/987,002

(22) Filed: Dec. 19, 2024

(65) Prior Publication Data

US 2025/0116033 A1 Apr. 10, 2025

Related U.S. Application Data

(63) Continuation of application No. 18/523,840, filed on Nov. 29, 2023, now Pat. No. 12,215,439, which is a continuation of application No. 18/310,645, filed on May 2, 2023, now Pat. No. 11,866,846.

(30) Foreign Application Priority Data

May 31, 2022 (JP) ................................ 2022-089089

(51) Int. Cl.
*C30B 29/36* (2006.01)

(52) U.S. Cl.
CPC .................................. *C30B 29/36* (2013.01)

(58) Field of Classification Search
CPC ...................................................... C30B 29/36
See application file for complete search history.

(56) References Cited

U.S. PATENT DOCUMENTS

| | | | | |
|---|---|---|---|---|
| 11,866,846 | B2 * | 1/2024 | Suo | C30B 29/36 |
| 12,215,439 | B2 * | 2/2025 | Suo | C30B 29/36 |
| 2021/0198804 | A1 | 7/2021 | Khlebnikov et al. | |

FOREIGN PATENT DOCUMENTS

| | | | |
|---|---|---|---|
| EP | 3 666 937 | A1 | 6/2020 |
| JP | 2007-290880 | A | 11/2007 |
| JP | 2013-139347 | A | 7/2013 |
| JP | 2015-059073 | A | 3/2015 |
| JP | 2016-501809 | A | 1/2016 |
| JP | 2017-069334 | A | 4/2017 |
| JP | 2017-145150 | A | 8/2017 |
| JP | 2021-503170 | A | 2/2021 |
| JP | 2021-102533 | A | 7/2021 |
| JP | 7132454 | B1 | 9/2022 |
| JP | 7268784 | B1 | 5/2023 |
| WO | 2019/111507 | A1 | 6/2019 |

OTHER PUBLICATIONS

Decision to Grant a Patent dated Mar. 22, 2023 for related Japanese Patent Application No. 2022-089089.

(Continued)

*Primary Examiner* — Elizabeth E Mulvaney
(74) *Attorney, Agent, or Firm* — Sughrue Mion, PLLC

(57) ABSTRACT

A SiC epitaxial wafer including: a SiC substrate; and a SiC epitaxial layer stacked on one surface of the SiC substrate, wherein a diameter of the SiC substrate is 195 mm or more, and a warp is 50 μm or less.

20 Claims, 7 Drawing Sheets

(56) References Cited

OTHER PUBLICATIONS

Japanese Office Action ("Notice of Reasons for Refusal") dated Dec. 13, 2022 for related Japanese Patent Application No. 2022-089089.
Japanese Office Action ("Notice of Reasons for Refusal") dated Jul. 26, 2022 for related Japanese Patent Application No. 2022-089089.
Office Communication (Notice of Allowance and Fee Due) dated Aug. 29, 2023 issued in related U.S. Appl. No. 18/310,645.
Office Communication (Non-Final Office Action) dated Aug. 1, 2024 issued in related U.S. Appl. No. 18/523,840.
Office Communication (Notice of Allowance and Fee Due) dated Sep. 30, 2024 issued in related U.S. Appl. No. 18/523,840.

* cited by examiner

SiC EPITAXIAL WAFER

CROSS-REFERENCE TO RELATED APPLICATIONS

This application is a Rule 53(b) Continuation of U.S. application Ser. No. 18/523,840 filed Nov. 29, 2023, which is a Rule 53(b) Continuation of U.S. application Ser. No. 18/310,645 filed May 2, 2023, now U.S. Pat. No. 11,866, 846, which claims priority based on Japanese Patent Application No. 2022-089089 filed May 31, 2022, the respective disclosures of all of the above of which are incorporated herein by reference in their entirety.

BACKGROUND OF THE INVENTION

Field of the Invention

The present invention relates to a SiC substrate and a SiC epitaxial wafer.

Description of Related Art

Silicon carbide (SiC) has a dielectric breakdown field one order of magnitude larger and a bandgap three times larger than silicon (Si). In addition, silicon carbide (SiC) has a property such as a thermal conductivity that is about three times as high as that of silicon (Si). Therefore, silicon carbide (SiC) is expected to be applied to power devices, high-frequency devices, high-temperature operation devices, and the like. Thus, in recent years, SiC epitaxial wafers have come to be used for such semiconductor devices.

A SiC epitaxial wafer is obtained by stacking a SiC epitaxial layer on a surface of a SiC substrate cut out from a SiC ingot. Hereinafter, a substrate before stacking the SiC epitaxial layer is referred to as the SiC substrate, and a substrate after stacking the SiC epitaxial layer is referred to as the SIC epitaxial wafer.

The SiC epitaxial wafer may warp because it has the SiC epitaxial layer on one surface. The warpage of the SiC epitaxial wafer adversely affects a process of a semiconductor device. For example, the warpage causes defocus in photolithographic processing. In addition, the warpage causes a decrease in positional accuracy of a wafer during a transport process. Furthermore, the SiC epitaxial wafer may warp greatly due to oxide film stacking or ion implantation during a semiconductor process.

Meanwhile, the SiC substrate is flat before stacking the SiC epitaxial layer. Therefore, it is difficult to predict the warpage of the SiC epitaxial wafer or the warpage during the semiconductor process in the state of the SiC substrate. For example, Patent Document 1 discloses that a difference in wavenumber shift amount of Raman scattered light is used to predict a value of warpage of a polished SiC single crystal product wafer before a polishing step is completed. Patent Document 2 discloses a substrate in which the Raman spectrum is measured in a thickness direction of the substrate and the stress distribution is reduced in the thickness direction. In addition, for example, Patent Document 3 discloses that warpage of a SiC substrate is reduced by alleviating crystallographic stress.

CITATION LIST

Patent Document

Patent Document 1:

Japanese Unexamined Patent Application, First Publication No. 2015-59073

Patent Document 2:

PCT International Publication No. WO2019/111507

Patent Document 3:

United States Patent Application, Publication No. 2021/0198804

Patent Document 4:

Japanese Unexamined Patent Application, First Publication No. 2007-290880

SUMMARY OF THE INVENTION

In Patent Document 1 and Patent Document 2, an internal stress of a substrate is evaluated using a Raman shift, but the Raman shift does not include information on a direction. In addition, Patent Document 1 to Patent Document 3 discloses that a stress decreases, but it is impossible to sufficiently suppress warpage of the SiC epitaxial wafer only by reducing the stress. Further, Patent Document 4 discloses that cracks on an ingot are suppressed by increasing the compressive stress in a peripheral direction of the ingot, however, it was impossible to sufficiently suppress the warpage of the SiC epitaxial wafer.

The present invention has been made in view of the above problems, and an object of the present invention is to provide a SiC substrate capable of suppressing warpage after performing a surface treatment such as stacking a SiC epitaxial layer, stacking an oxide film, performing ion implantation, or the like.

The present inventors have found that it is possible to suppress the warpage after performing the surface treatment such as the stacking of the SiC epitaxial layer or the like, by increasing the tensile stress in a circumferential direction in the vicinity of an outer periphery to be larger than the tensile stress in a circumferential direction in the vicinity of a center. That is, the present invention provides the following means in order to solve the above problems.

(1) In a SiC substrate according to a first aspect, in a case where a point 10 mm inside from an outer peripheral edge in a [11-20] direction from a center is defined as a first outer peripheral point and any point within a circle having a diameter of 10 mm from the center is defined as a first center point, the tensile stress of the first outer peripheral point in a <1-100> direction, which is a circumferential direction of the first outer peripheral point, is larger than the tensile stress of the first center point in the <1-100> direction, which is the same direction as the circumferential direction of the first outer peripheral point.

(2) In the SiC substrate according to the aspect described above, in a case where a point 10 mm inside from the outer peripheral edge in a [−1100] direction from the center is defined as a second outer peripheral point, the tensile stress of the second outer peripheral point in a <11-20> direction, which is the same direction as a circumferential direction of the second outer peripheral point, may be larger than the tensile stress of the first center point in the <11-20> direction, which is the same direction as the circumferential direction of the second outer peripheral point.

(3) In a SiC substrate according to a second aspect, in a case where a point 10 mm inside from an outer peripheral edge in a [−1100] direction from a center is defined as a second outer peripheral point and any point within a circle having a diameter of 10 mm from the center is defined as a first center point, the tensile stress of the second outer peripheral point in a <11-20> direction, which is a circumferential direction of the second outer peripheral point, is larger than the tensile stress of the first center point in the <11-20> direction, which is the same direction as the circumferential direction of the second outer peripheral point.

(4) In the SiC substrate according to the aspect described above, in a case where a point 10 mm inside from the outer peripheral edge in a [11-20] direction from the center is defined as a first outer peripheral point, the tensile stress of the first outer peripheral point in a <1-100> direction, which is the same direction as a circumferential direction of the first outer peripheral point, may be larger than the tensile stress of the first center point in the <1-100> direction, which is the same direction as the circumferential direction of the first outer peripheral point.

(5) In the SiC substrate according to the aspect described above, the tensile stress of the first outer peripheral point in the circumferential direction of the first outer peripheral point may be larger than the tensile stress of the first center point acting in the same direction as the circumferential direction of the first outer peripheral point by 10 MPa or more. In addition, the tensile stress of the second outer peripheral point in the circumferential direction may be larger than the tensile stress of the first center point acting in the same direction as the circumferential direction of the second outer peripheral point by 10 MPa or more.

(6) In the SiC substrate according to the aspect described above, the tensile stress of the first outer peripheral point in the circumferential direction of the first outer peripheral point may be larger than the tensile stress of the first center point acting in the same direction as the circumferential direction of the first outer peripheral point by 30 MPa or more. In addition, the tensile stress of the second outer peripheral point in the circumferential direction may be larger than the tensile stress of the first center point acting in the same direction as the circumferential direction of the second outer peripheral point by 30 MPa or more.

(7) The SiC substrate according to the aspect described above may have a diameter of 145 mm or more.

(8) The SiC substrate according to the aspect described above may have a diameter of 195 mm or more.

(9) In the SiC substrate according to the aspect described above, a first surface may have a surface roughness (Ra) of 1 nm or less.

(10) The SiC substrate according to the aspect described above may have a warp of 50 μm or less.

(11) In the SiC substrate according to the aspect described above, in a first surface, in a case where supports are positioned to overlap with a circumference on 7.5 mm inside from an outermost periphery and a plane connecting parts overlapping with the supports when seen in a thickness direction is defined as a reference plane, a bow may be 30 μm or less.

(12) A SiC epitaxial wafer according to a third aspect includes the SiC substrate according to the aspect described above, and a SiC epitaxial layer stacked on one surface of the SiC substrate.

(13) The SiC epitaxial wafer according to the aspect described above may have a warp of 50 μm or less.

(14) In the SiC epitaxial wafer according to the aspect described above, in a surface of the SiC epitaxial layer, in a case where supports are positioned to overlap with a circumference on 7.5 mm inside from an outermost periphery and a plane passing through parts overlapping with the supports when seen in a thickness direction is defined as a reference plane, a bow may be 30 μm or less.

The SiC substrate according to the aspect described above can suppress the warpage after performing surface treatment such as stacking a SiC epitaxial layer.

DETAILED DESCRIPTION OF THE INVENTION

Figure 1:
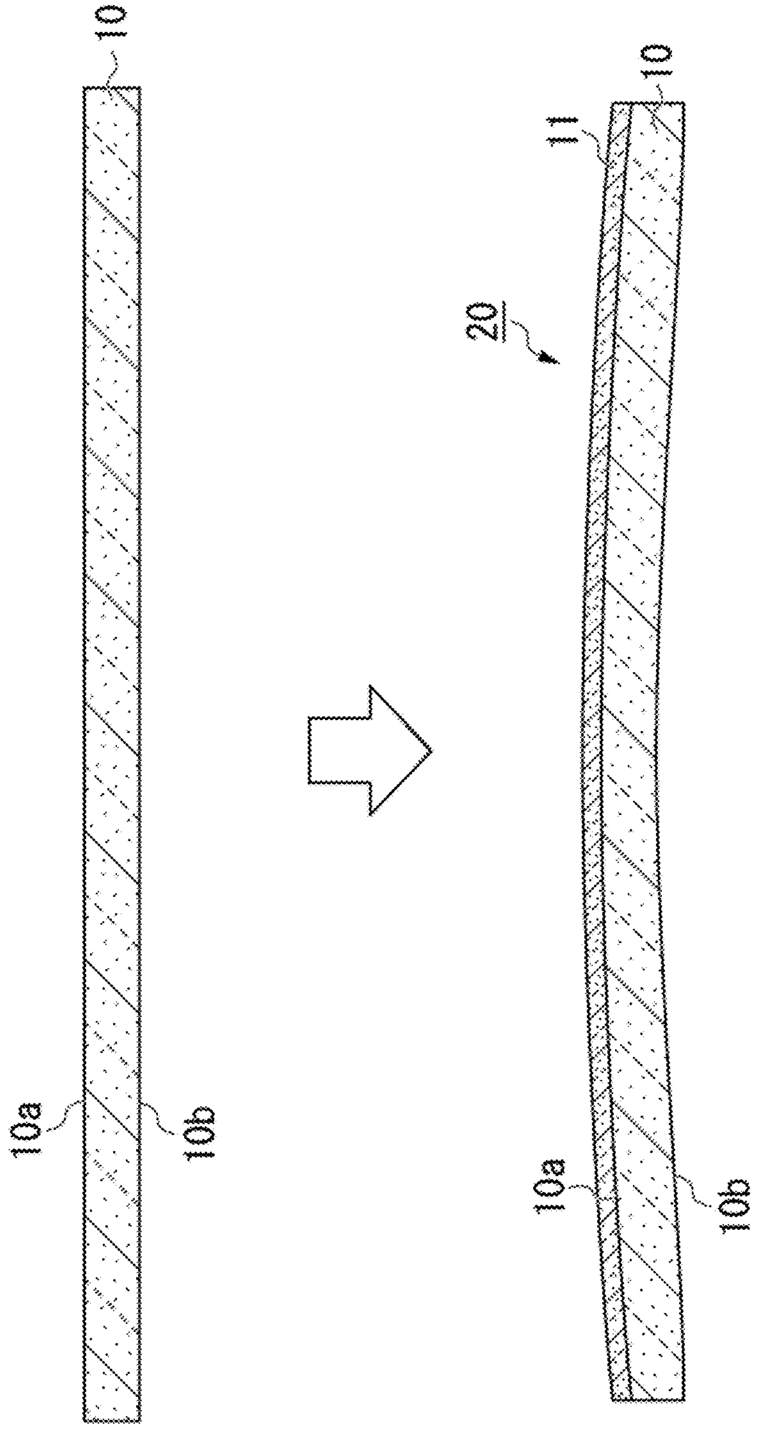
FIG. 1 is a schematic diagram showing a warpage of a SiC epitaxial wafer.

Hereinafter, a SiC substrate and the like according to the present embodiment will be described in detail with appropriate reference to the drawings. In the drawings used in the following description, characteristic parts may be enlarged for the sake of convenience in order to make it easier to understand the characteristics of the present embodiment, and dimensional ratios of constituent elements or the like may differ from the actual ones. Materials, dimensions, and the like exemplified in the following description are merely examples, and the present invention is not limited thereto and can be modified as appropriate without changing the gist of the invention.

First, warpage of a SiC epitaxial wafer 20 will be described. FIG. 1 is a schematic diagram showing the warpage of the SiC epitaxial wafer 20. The SiC epitaxial wafer 20 is obtained by stacking a SiC epitaxial layer 11 on a first surface 10*a* of a SiC substrate 10. The SiC epitaxial wafer 20 includes the SiC substrate 10 and the SiC epitaxial layer 11.

The SiC substrate 10 has no large warpage and is substantially flat. The term "substantially flat" means that there is no part that rises significantly when placed on a flat surface.

The SiC epitaxial layer 11 is stacked on the SiC substrate 10 in order to obtain high-quality SiC on which a device can operate. In addition, mechanical processing such as polishing is often performed before stacking the SiC epitaxial layer 11. In this case, a work-affected layer is formed on the first surface 10*a* of the SiC substrate 10. The SiC epitaxial wafer 20 may warp, in a case where the SiC epitaxial layer 11 is stacked or the work-affected layer is formed on one surface of the SiC substrate 10.

First Embodiment

Figure 2:
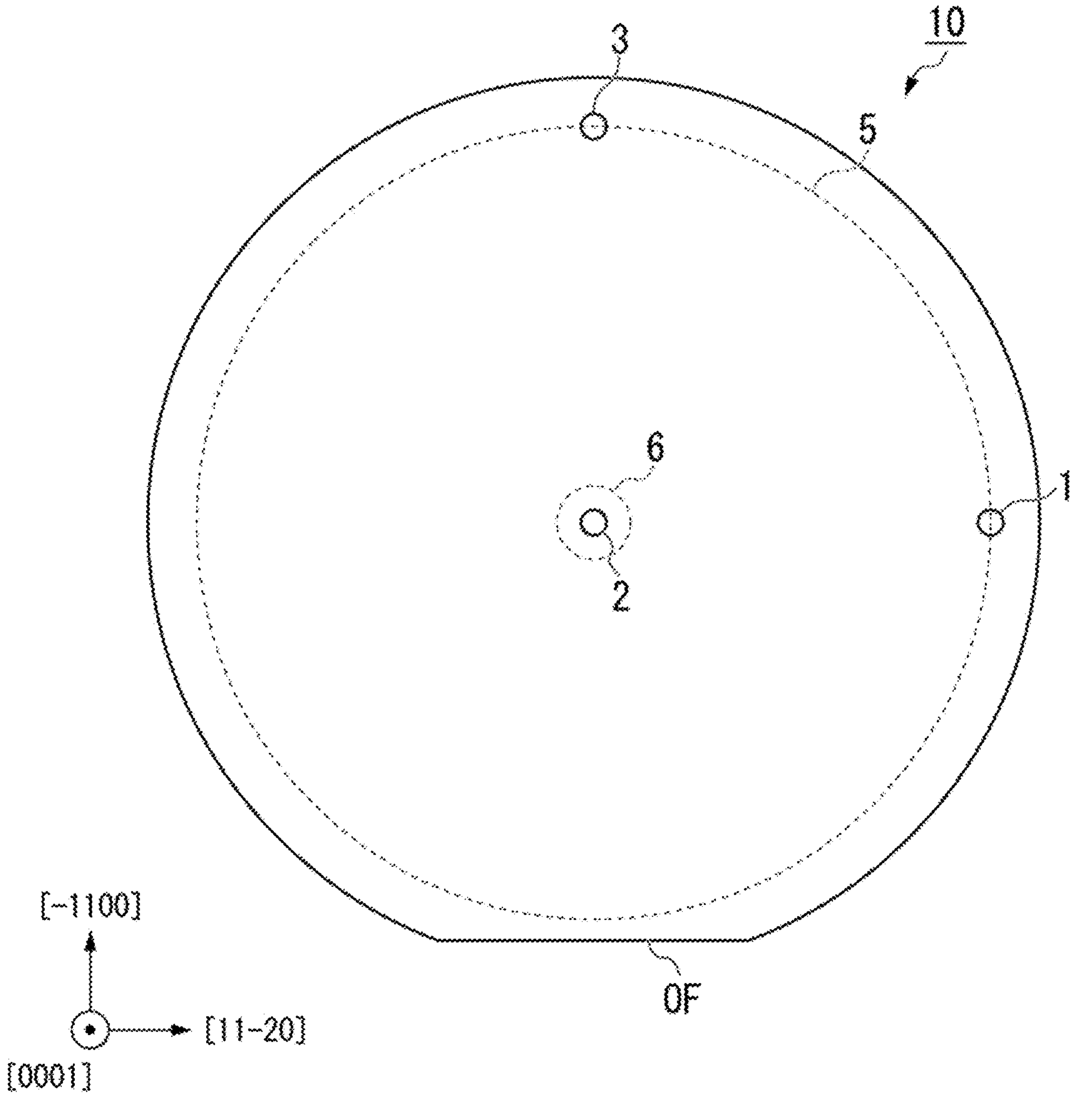
FIG. 2 is a plan view of a SiC substrate according to the present embodiment.

FIG. 2 shows the SiC substrate 10 according to the present embodiment. The SiC substrate 10 is formed of SiC. A polytype of the SiC substrate 10 is not particularly limited and may be any of 2H, 3C, 4H, and 6H. The SiC substrate 10 is, for example, 4H—SiC.

A planar view shape of the SiC substrate 10 is substantially circular. The SiC substrate 10 may have an orientation flat OF or a notch for determining a direction of a crystal axis. A diameter of the SiC substrate 10 is, for example, 145 mm or more, and preferably 195 mm or more. The larger the diameter of the SiC substrate 10, the larger the absolute amount of warpage even with the same curvature. A SiC epitaxial wafer with large warpage has a great influence on subsequent steps, and it is required to suppress the warpage. In other words, the present invention is more effective as it is applied to the SiC substrate 10 having a large diameter.

In the SiC substrate 10 according to the present embodiment, the tensile stress in a <1-100> direction, which is a circumferential direction of a first outer peripheral point 1, is larger than the tensile stress of a first center point 2 in the <1-100> direction, which is the same direction as the circumferential direction of the first outer peripheral point 1. The tensile stress of the first outer peripheral point 1 in the circumferential direction is larger than the tensile stress of the first center point 2 acting in the same direction as the circumferential direction of the first outer peripheral point 1 preferably by 10 MPa or more and more preferably by 30 MPa or more.

The first outer peripheral point 1 is on an outer peripheral part 5 10 mm inside from an outer peripheral edge of the SiC substrate 10. The first outer peripheral point 1 is a point on the outer peripheral part 5 in a [11-20] direction from a center of the SiC substrate 10. The first center point 2 is any point within a center part 6. The center part 6 is a region within a circle having a diameter of 10 mm from the center of the SiC substrate 10. The first center point 2 coincides with the center of the SiC substrate 10, for example.

Here, < > and [ ] are used as bracket notations indicating directions of the Miller index. <1-100> includes [−1100] due to the symmetry of a crystal direction. <11-20> includes [11-20] due to the symmetry of the crystal direction.

The tensile stress is calculated as the product of a strain ε and a Young's modulus. The strain & is obtained by $(a_0-a)/a_0$. $a_0$ is a reference lattice constant. $a_0$ is approximately 3.08 Å in a case of 4H—SiC. a is a lattice constant obtained by an X-ray diffraction method (XRD). A direction of the stress is obtained from a direction of incident X-rays in the X-ray diffraction. In the present invention, tension is considered a positive value, and compression is considered a negative value. When discussing the magnitude of stress, the magnitude is defined by an absolute value. As the lattice constant a becomes smaller than the reference lattice constant $a_0$, the strain & increases. As a result, the tensile stress increases.

Figure 3:
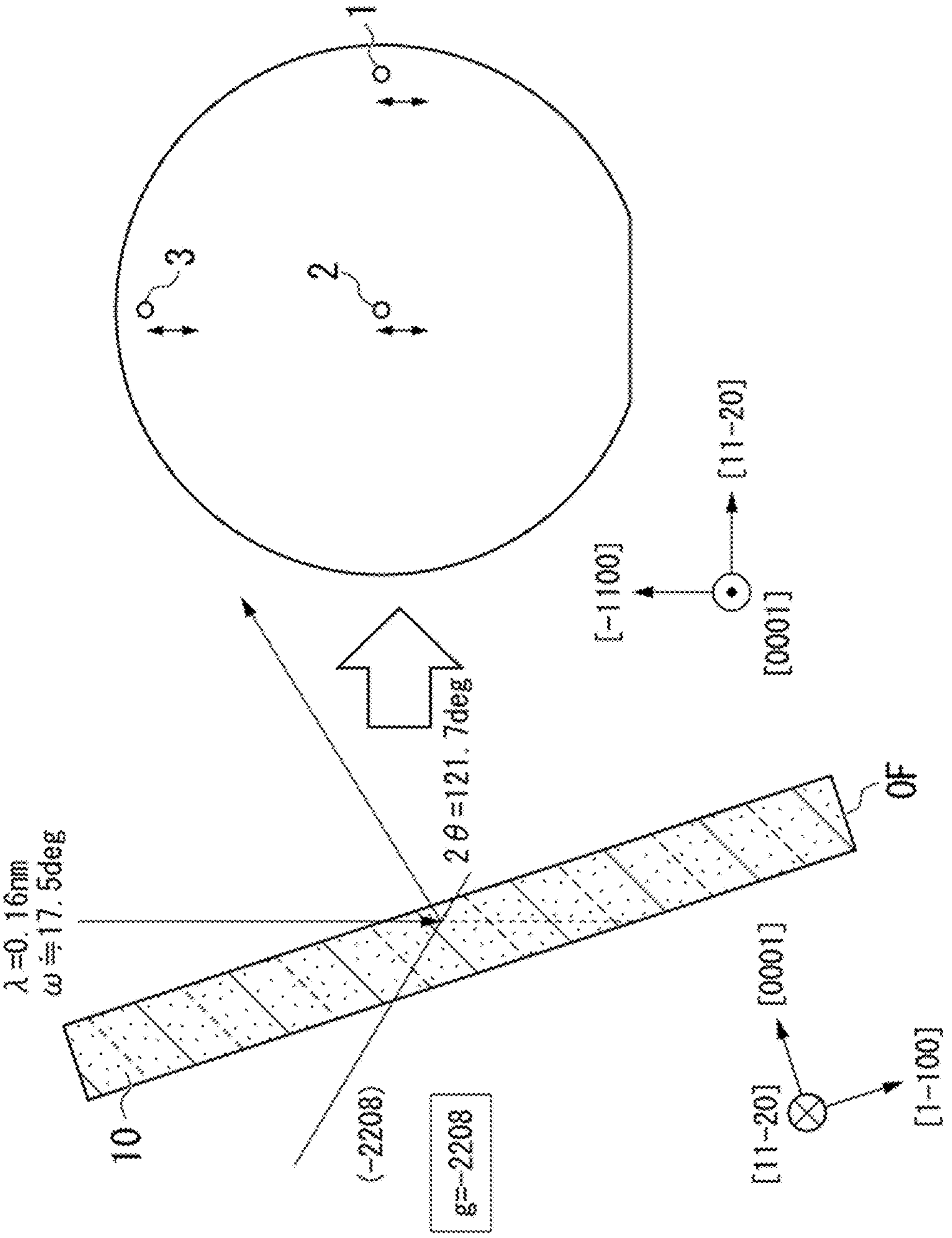
FIG. 3 is a schematic diagram showing a method for measuring the tensile stress of a first outer peripheral point in a circumferential direction.

FIG. 3 is a schematic diagram showing a method for measuring the tensile stress of the first outer peripheral point 1 in the circumferential direction. The circumferential direction of the first outer peripheral point 1 is a direction orthogonal to a line segment connecting the center of the SiC substrate 10 and the first outer peripheral point 1 (hereinafter, referred to as a first direction). The first direction is the <1-100> direction. In a case of measuring the tensile stress of the first outer peripheral point 1 in the circumferential direction, X-rays are irradiated from the first direction. By emitting the X-rays to the SiC substrate 10 from this circumferential direction, the lattice constant a of the first outer peripheral point 1 in the circumferential direction is obtained. Then, using this lattice constant a, the stress in the circumferential direction of the first outer peripheral point 1 is obtained from the above equation. In a case where the actually measured lattice constant a is smaller than the reference lattice constant $a_0$, it is assumed that the tensile stress is acting.

The tensile stress of the first center point 2 acting in the same direction as the circumferential direction of the first outer peripheral point 1 is obtained by emitting the X-rays to the first center point 2 by the same method for the first outer peripheral point 1. The same direction as the circumferential direction of the first outer peripheral point 1 is the first direction described above. The first outer peripheral point 1 and the first center point 2 are compared in magnitude of the tensile stress acting in the same direction (the first direction).

In a case where the tensile stress in the circumferential direction of the first outer peripheral point 1 is greater than the tensile stress of the first center point 2 acting in the same direction as the circumferential direction of the first outer peripheral point 1, the SiC epitaxial wafer 20 is less likely to warp after stacking the SiC epitaxial layer 11. It is considered that this is because, as a strong tensile stress is applied to the circumferential direction of the first outer peripheral point 1, a force for widening the SiC epitaxial wafer 20 outward acts on the SiC epitaxial wafer 20.

In addition, in the SiC substrate 10 according to the present embodiment, the tensile stress of the second outer peripheral point 3 in the circumferential direction is preferably greater than the tensile stress of the first center point 2 acting in the same direction as the circumferential direction of the second outer peripheral point 3. The tensile stress in the circumferential direction of the second outer peripheral point 3 is larger than the tensile stress of the first center point 2 acting in the same direction as the circumferential direction of the second outer peripheral point 3 preferably by 10 MPa or more and more preferably by 30 MPa or more.

The second outer peripheral point 3 is on an outer peripheral part 5 10 mm inside from an outer peripheral edge of the SiC substrate 10. The second outer peripheral point 3 is a point on the outer peripheral part 5 in a [−1100] direction from a center of the SiC substrate 10.

Figure 4:
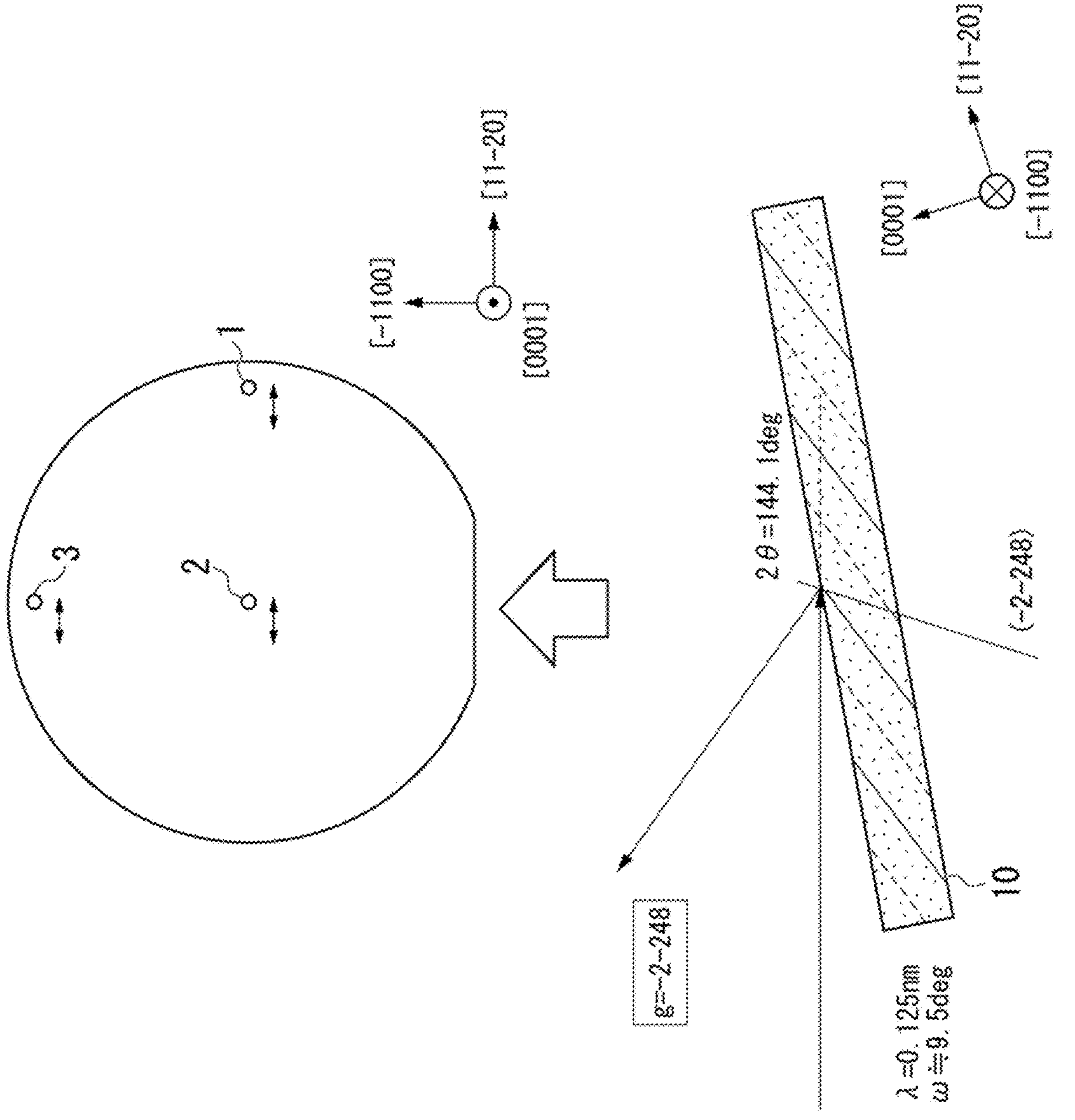
FIG. 4 is a schematic diagram showing a method of measuring the tensile stress of a second outer peripheral point in a circumferential direction.

FIG. 4 is a schematic diagram showing a method for measuring the tensile stress of the second outer peripheral point 3 in the circumferential direction. The circumferential direction of the second outer peripheral point 3 is a direction orthogonal to a line segment connecting the center of the SiC substrate 10 and the second outer peripheral point 3 (hereinafter, referred to as a second direction). The second direction is the <11-20> direction. In a case of measuring the tensile stress of the second outer peripheral point 3 in the circumferential direction, X-rays are irradiated from the second direction. By emitting the X-rays to the SiC substrate 10 from this circumferential direction, the lattice constant a of the second outer peripheral point 3 in the circumferential direction is obtained. Then, using this lattice constant a, the tensile stress in the circumferential direction of the second outer peripheral point 3 is obtained from the above equation.

In a case of comparing the tensile stress of the second outer peripheral point 3 in the circumferential direction with the tensile stress of the first center point 2 acting in the same direction as the circumferential direction of the second outer peripheral point 3, the tensile stress of the first center point 2 in the <11-20> direction which is the same direction as the circumferential direction of the second outer peripheral point 3 is obtained. The tensile stress of the first center point 2 acting in the same direction as the circumferential direction of the second outer peripheral point 3 is obtained by emitting the X-rays to the first center point 2 by the same method for the second outer peripheral point 3. The same direction as the circumferential direction of the second outer peripheral point 3 is the second direction described above.

In a case where the tensile stress in the circumferential direction of the second outer peripheral point 3 is greater than the tensile stress of the first center point 2 acting in the same direction as the circumferential direction of the second outer peripheral point 3, the SiC epitaxial wafer 20 is further less likely to warp after stacking the SiC epitaxial layer 11. It is considered that this is because a force for widening the SiC epitaxial wafer 20 outward acts in different directions in plane of the SiC epitaxial wafer 20.

In addition, in the SiC substrate 10 according to the present embodiment, it is preferable that the tensile stress in the circumferential direction is larger than the tensile stress of the first center point 2 at any position on the outer peripheral part 5. Here, the tensile stress of the first center point 2 is the tensile stress acting in the same direction as the circumferential direction at a measurement point. In addition, the average tensile stress applied to a region on an outer side of the outer peripheral part 5 is preferably larger than the average tensile stress applied to the center part 6. Here, the average tensile stress is, for example, the average value of tensile stresses measured at five different points within the region.

A surface of the SiC substrate 10 is often ground. A surface roughness (Ra) of the first surface 10*a* of the SiC substrate 10 is preferably, for example, 1 nm or less. The first surface 10*a* is, for example, a surface on which the SiC epitaxial layer 11 is stacked.

Both of the first surface 10*a* and a second surface 10*b* of the SiC substrate 10 may be ground. The first surface 10*a* is, for example, a Si surface, and the second surface 10*b* is, for example, a C surface. The relationship between the first surface 10*a* and the second surface 10*b* may be reversed. Both the first surface 10*a* and the second surface 10*b* may be mirror-finished mirror surfaces with residual scratches or the like, or may be CMP-processed surfaces subjected to chemical mechanical Polishing (CMP), and the polishing degree may be different between the first surface 10*a* and the second surface 10*b*. The work-affected layer is formed on the mirror surface with residual scratches or the like, and almost no work-affected layer is formed on the CMP-processed surface. The work-affected layer is a part that has been damaged by processing and has a collapsed crystal structure.

For example, in a case where the first surface 10*a* is a mirror-ground surface and the second surface 10*b* is a CMP-processed surface, the Twyman effect occurs in the SiC substrate 10 due to a difference in surface state between the two surfaces. The Twyman effect is a phenomenon in which, in a case where there is a difference occurs in residual stress on both surfaces of a substrate, a force acts to compensate for the difference in stress on both surfaces. The Twyman effect may cause the warpage of the SiC epitaxial wafer 20. That is, the present invention is more effective as it is applied to the SiC substrate 10 in which the surface states of the first surface 10*a* and the second surface 10*b* are different.

The SiC substrate 10 according to the present embodiment preferably has a warp of 50 μm or less, and more preferably 30 μm or less. In a case where the SiC substrate 10 satisfying the relationship of the tensile stress with the warp of 50 μm or less is used, it is possible to sufficiently reduce the warpage of the SiC epitaxial wafer 20. Therefore, the SiC epitaxial wafer 20 can be prevented from being lowered in accuracy during transportation, and can be properly focused even in a fine lithography process.

Figure 5:
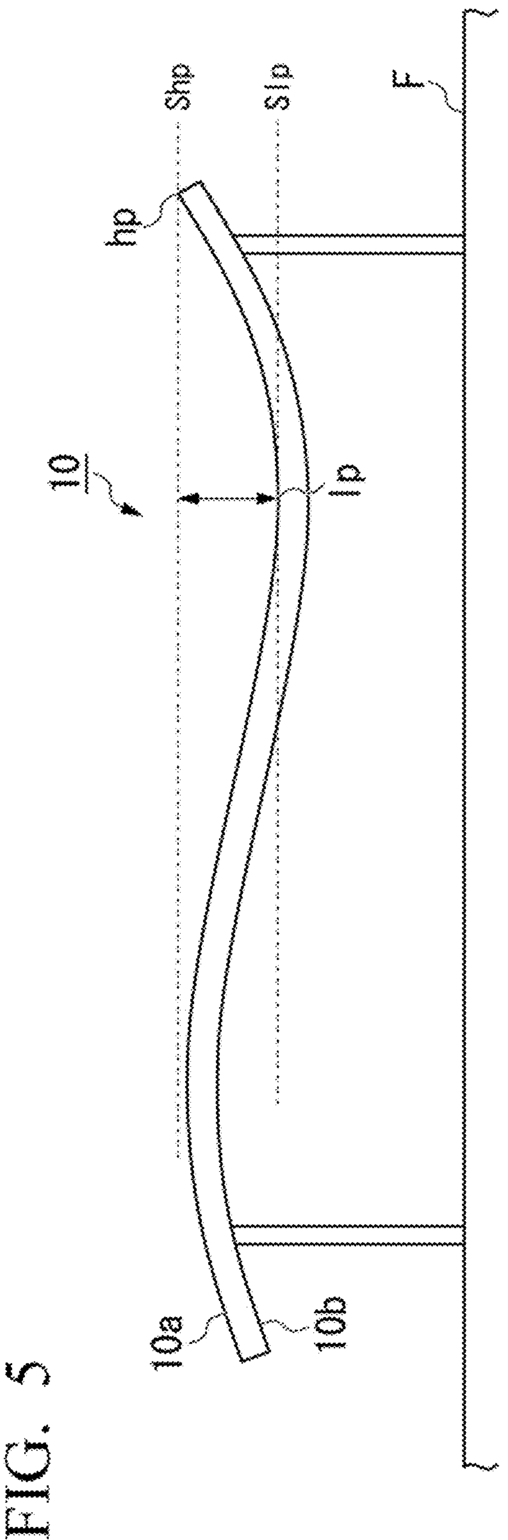
FIG. 5 is a diagram schematically showing a method for evaluating the shape of a SiC substrate due to a warp.

FIG. 5 is a diagram schematically showing a method for evaluating the shape (deformation) of a SiC substrate due to a warp. The warp is a distance between a highest point hp and a lowest point lp of the first surface 10*a* in a thickness direction. It is determined that the larger the warp is, the more the SiC substrate 10 is deformed. First, the SiC substrate 10 is placed on three support points placed on a flat surface F. A virtual plane Slp which passes through the lowest point lp of the first surface 10*a* and is parallel to the flat surface F and a virtual plane Shp which passes through the highest point hp of the first surface 10*a* and is parallel to the flat surface F are obtained. The warp is obtained as a distance between the virtual plane Slp and the virtual plane Shp in a height direction. The height direction is a direction orthogonal to the flat surface F and away from the flat surface F.

The SiC substrate 10 according to the present embodiment preferably has a bow of 30 μm or less, and more preferably 10 μm or less. In addition, the bow is preferably −30 μm or more. In a case where the SiC substrate 10 satisfying the relationship of the tensile stress with an absolute value of the bow of 30 μm or less is used, it is possible to sufficiently reduce the warpage of the SiC epitaxial wafer 20. Therefore, the SiC epitaxial wafer 20 can be prevented from being lowered in accuracy during transportation, and can be properly focused even in a fine lithography process.

Figure 6:
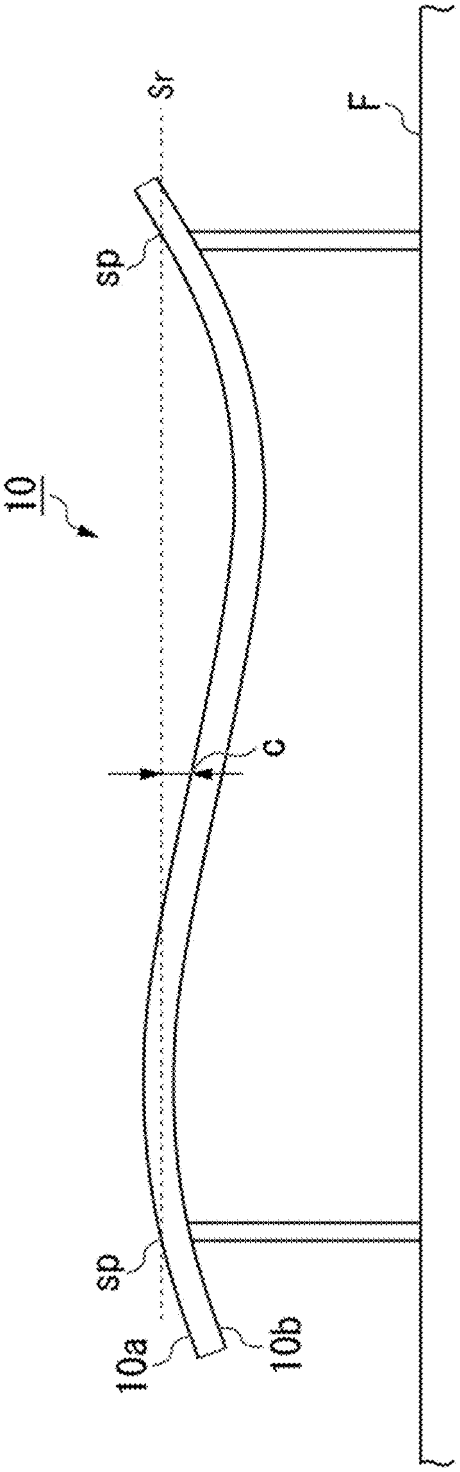
FIG. 6 is a diagram schematically showing a method for evaluating the shape of a SiC substrate due to a bow.

FIG. 6 is a diagram schematically showing a method for evaluating the shape (deformation) of a SiC substrate due to a bow. The bow is a position of a center c of the SiC substrate 10 with respect to a reference plane Sr in the height direction. In other words, the bow is a signed distance of the center c of the SiC substrate 10 from the reference plane Sr. The reference plane Sr is a plane connecting points sp of the first surface 10*a* overlapping each of the plurality of supports, when seen in the thickness direction. The plurality of supports are arranged, for example, at positions overlapping a circumference of the SiC substrate 10 7.5 mm inside from the outer peripheral edge. For example, the SiC substrate 10 is supported by three supports. Each of the three supports is positioned 3-fold symmetrically about the center of the SiC substrate 10 supported by the support. The reference plane Sr is, for example, a 3-point reference flat plane. It is determined that the larger the absolute value of the bow is, the more the SiC substrate 10 is deformed. First, the SiC substrate 10 is placed on three support points placed on a flat surface F. The reference plane Sr is obtained by connecting three points sp of the first surface 10*a* on a support point when seen in the thickness direction. Then, the reference plane Sr is defined as 0, a direction away from the flat surface F with reference to the reference plane Sr is defined as +, and a direction approaching the flat surface F with reference to the reference plane Sr is defined as −. The bow is obtained as a position of the center c of the first surface 10*a* with respect to the reference plane Sr in the height direction. In other words, the bow is obtained as a signed distance of the center c of the first surface 10*a* from the reference plane Sr.

In addition, the SiC epitaxial wafer 20 after stacking the SiC epitaxial layer 11 also has the warp of preferably 50 μm or less and more preferably 30 μm or less. Further, the SiC epitaxial wafer after stacking the SiC epitaxial layer 11 also has the bow of preferably 30 μm or less, more preferably 10 μm or less, and preferably −30 μm or more. The reference plane for measuring the bow of the SiC epitaxial wafer 20 is a plane connecting points of the surface of the SiC epitaxial layer 11 overlapping each of the plurality of supports when seen in the thickness direction. The positions of the plurality of supports are the same as the positions for measuring the bow of the SiC substrate 10. First, the SiC epitaxial wafer 20 is placed on three support points placed on the flat surface F. Three points on the surface of the SiC epitaxial layer 11 on the support point when seen in the thickness direction are connected, and the reference plane for measuring the bow of the SiC epitaxial wafer 20 is obtained. The bow is obtained as the position of the center of the surface of the SiC epitaxial layer 11 with respect to the reference plane in the height direction. In other words, the bow is obtained as a signed distance of the center of the surface of the SiC epitaxial layer 11 from the reference plane.

Next, an example of a method for manufacturing the SiC substrate 10 according to the present embodiment will be described. The SiC substrate 10 is obtained by slicing a SiC ingot. The SiC ingot is obtained, for example, by a sublimation method.

Figure 7:
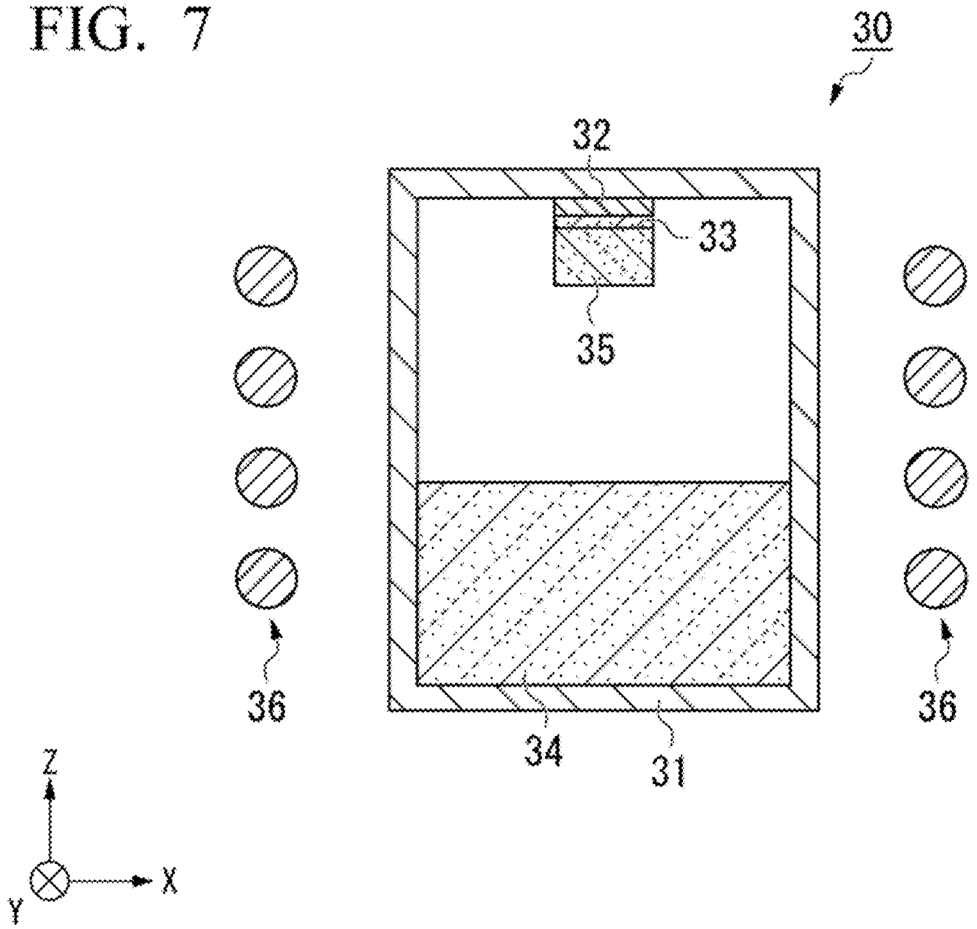
FIG. 7 is a schematic diagram showing a sublimation method, which is an example of a SiC ingot manufacturing apparatus.

FIG. 7 is a schematic diagram showing a sublimation method, which is an example of a SiC ingot manufacturing apparatus 30. In FIG. 7, a direction orthogonal to a surface of a pedestal 32 is defined as a z direction, one direction orthogonal to the z-direction is defined as an x direction, and a direction orthogonal to the z direction and the x direction is defined as a y direction.

The sublimation method is a method for disposing a seed crystal 33 formed of SiC single crystal on the pedestal 32 disposed in a crucible 31 formed of graphite, heating the crucible 31 to supply a sublimation gas sublimated from a raw material powder 34 in the crucible 31 to the seed crystal 33, and growing the seed crystal 33 into a larger SiC ingot 35. The heating of the crucible 31 is performed by a coil 36, for example.

By controlling crystal growth conditions in the sublimation method, the tensile stress applied to an inner part of the SiC substrate 10 obtained from the SiC ingot 35 can be controlled.

For example, in a case of performing c plane growth of the SiC ingot 35, a temperature of a center part of a crystal growth surface and a temperature of an outer peripheral part are controlled. The crystal growth surface is a surface during a growth process of the crystal. For example, in a case of performing the c plane growth of the SiC ingot 35, the temperature of the outer peripheral part is reduced to be lower than the temperature of the center part of the crystal growth surface. In addition, the crystal growth is performed so that a difference in growth speed between the center and the outer periphery in an xy plane is 0.001 mm/h or more and 0.05 mm/h or less. Here, the growth speed of in the center in the xy plane is reduced to be slower than the growth speed of the outer periphery. The growth speed is changed by changing the temperature of the crystal growth surface.

The temperature of the crystal growth surface can be adjusted by controlling a position of a heating center of the crucible 31 due to the coil 36 in the z direction. For example, the position of the heating center of the crucible 31 in the z direction can be changed by changing the position of the coil 36 in the z direction. The position of the heating center of the crucible 31 in the z direction and the position of the crystal growth surface in the z direction are controlled to be separated by 0.5 mm/h. Here, the position of the heating center of the crucible 31 in the z direction is controlled to be on a lower side (a side of the raw material powder 34) with respect to the position of the crystal growth surface in the z direction.

Next, the SiC ingot manufactured under such conditions is processed into the SiC substrate 10. In a general processing method, the stress applied to the single crystal changes depending on a state of the SiC ingot and a state of the SiC substrate. For example, in a shaping step, when processing the SiC ingot having a diameter of 180 mm into the SiC substrate having a diameter of 150 mm, it is necessary to reduce the diameter. In addition, for example, in a multi-wire cutting step, undulations occur on the surface, and it is necessary to remove the undulations. Through such a step, for example, a part of the SiC ingot having a large stress may be removed or a shape of a crystal lattice surface is changed, the stress of the state of the SiC ingot may be released in the state of the SiC substrate, and a SiC substrate having a large tensile stress on the outer peripheral part cannot be obtained. In order to obtain a SiC substrate having a large tensile stress on the outer peripheral part, it is necessary to perform processing so that the stress applied to the single crystal in the state of the ingot is transferred to the state of the substrate.

For example, after performing damage-free processing on one surface of the SiC ingot, it is cut with a single wire saw, and the damage-free-processed surface is adsorbed to further perform the damage-free processing on the cut surface. By performing the damage-free processing on both surfaces of the SiC substrate 10, a part of the tensile stress generated in the state of the SiC ingot is transferred to the substrate. The damage-free processing is, for example, CMP processing. By performing substrate processing to remain a lattice surface shape of the state of the SiC ingot, the SiC substrate 10 having a large tensile stress can be manufactured without releasing the stress of the SiC ingot. After that, by performing a shaping step for adjusting the diameter, the SiC substrate 10 having a large tensile stress can be obtained.

As described above, the SiC substrate 10 according to the first embodiment is less likely to warp even after the SiC epitaxial layer 11 is stacked. It is considered that this is because a force for widening the SiC epitaxial wafer 20 outward acts by intentionally increasing the tensile stress in a peripheral direction on an outer side of the SiC substrate 10.

Second Embodiment

In the SiC substrate 10 according to a second embodiment, the tensile stress in the <11-20> direction, which is a circumferential direction of the second outer peripheral point 3, is larger than the tensile stress of the first center point 2 acting in the <11-20> direction, which is the same direction as the circumferential direction of the second outer peripheral point 3. The SiC substrate 10 of the second embodiment is the same as the SiC substrate 10 of the first embodiment, except that measurement points for defining the state of the SiC substrate 10 are different. For example, the preferred ranges of the warp, the bow, the diameter, the surface roughness, and the like of the SiC substrate 10 according to the second embodiment are the same as those of the SiC substrate 10 according to the first embodiment.

The tensile stress of the second outer peripheral point 3 in the circumferential direction is larger than the tensile stress of the first center point 2 acting in the same direction as the circumferential direction of the second outer peripheral point 3 preferably by 10 MPa or more and more preferably by 30 MPa or more.

In addition, the tensile stress in a <1-100> direction, which is a circumferential direction of a first outer peripheral point 1, is preferably larger than the tensile stress of a first center point 2 in the <1-100> direction, which is the same direction as the circumferential direction of the first outer peripheral point 1. The tensile stress in the circumferential direction of the first outer peripheral point 1 is larger than the tensile stress of the first center point 2 acting in the same direction as the circumferential direction of the first outer peripheral point preferably by 10 MPa or more and more preferably by 30 MPa or more.

The SiC substrate 10 according to the second embodiment has the same effect as the SiC substrate 10 according to the first embodiment.

Although the preferred embodiments of the present invention have been described in detail above, the present invention is not limited to specific embodiments, and can be variously modified and changed within the gist of the present invention described in claims.

EXAMPLES

Example 1

A warpage in a case where a SiC epitaxial layer was stacked on a surface of a SiC substrate was obtained by simulation. The simulation was performed using the finite element method simulator ANSYS. It was separately confirmed that the simulation using the finite element method simulator ANSYS matched a result of an actually manufactured product.

The simulation was performed in the following procedure. First, physical property values of the SiC substrate and a surface layer having a different stress were set. The physical property values to be set were a plate thickness of the SiC substrate, a film thickness of the surface layer, a Young's modulus, and a Poisson's ratio. The plate thickness of the SiC substrate was set to 350 μm. A diameter of the SiC substrate was 150 mm. A warp of the SiC substrate was set to 0 μm. The Young's modulus of the SiC substrate was set to 480 GPa and the Poisson's ratio thereof was set to 0.20. The film thickness of the surface layer was set to 10 μm. Here, considering a case where the stress was generated in the surface layer by ion implantation, the same values as those of the SiC substrate were used for the Young's modulus and Poisson's ratio of the surface layer.

Next, a stress distribution of the SiC substrate and a stress of the surface layer were set. First, the stress distribution of the SiC substrate was set. The tensile stress of the first outer peripheral point 1 of the SiC substrate was set to be larger than the tensile stress of the first center point 2 by 40 MPa. That is, the difference in stress between the first outer peripheral point 1 and the first center point 2 was set to 40 MPa, and the first outer peripheral point 1 was set to be applied with stronger tensile stress than that of the first center point. The stress of 60 MPa was applied to the entire surface layer.

The simulation was performed under the above conditions to obtain the warpage of the SiC substrate with the surface layer. The warpage was evaluated by a warp. The warpage (the warp) of Example 1 was 47 μm. The warpage of the SiC substrate with the surface layer can be regarded as warpage of an epitaxial wafer by regarding the surface layer as an epitaxial layer. In a case where the surface layer was an epitaxial layer, the magnitude of warp changes depending on a stress difference that depends on a film thickness of the epitaxial layer or a difference in impurity concentration. However, it was confirmed that there was a correlation with the obtained warpage of the SiC substrate with the surface layer.

Example 2

Example 2 was different from Example 1 in that the tensile stress of the first outer peripheral point 1 of the SiC substrate was set to be larger than the tensile stress of the first center point 2 by 20 MPa. That is, a difference in stress between the first outer peripheral point 1 and the first center point 2 was set to 20 MPa, and the first outer peripheral point 1 was set to be applied with stronger tensile stress than that of the first center point. Other parameters were set as the same as in Example 1, and the warpage (the warp) of the SiC substrate with the surface layer was obtained by the simulation in the same manner as in Example 1. The warpage (the warp) of Example 2 was 78 μm.

Comparative Example 1

Comparative Example 1 was different from Example 1 in that the tensile stress of the first outer peripheral point 1 of the SiC substrate was set to be the same as the tensile stress of the first center point 2. That is, the difference in stress between the first outer peripheral point 1 and the first center point 2 was set to 0 MPa, and the first outer peripheral point 1 was set to be applied with the same stress as that of the first center point 2. Other parameters were set as the same as in Example 1, and the warpage (the warp) of the SiC substrate with the surface layer was obtained by the simulation in the same manner as in Example 1. The warpage (the warp) of Comparative Example 1 was 116 μm.

Comparative Example 2

Comparative Example 2 was different from Example 1 in that the tensile stress of the first center point 2 of the SiC substrate was set to be larger than the tensile stress of the first outer peripheral point 1 by 20 MPa. That is, a difference in stress between the first outer peripheral point 1 and the first center point 2 was set to −20 MPa, and the first center point 2 was set to be applied with stronger tensile stress than that of the first outer peripheral point 1. That is, the first outer peripheral point 1 was applied with a compressive stress than the first center point 2. Other parameters were set as the same as in Example 1, and the warpage (the warp) of the SiC substrate with the surface layer was obtained by the simulation in the same manner as in Example 1. The warpage (the warp) of Comparative Example 2 was 189 μm.

The results of Examples 1 and 2 and Comparative Examples 1 and 2 were summarized in Table 1.

TABLE 1

| | Difference in stress (first outer peripheral point-first center point) | Warpage |
|---|---|---|
| Example 1 | 40 MPa | 47 μm |
| Example 2 | 20 MPa | 78 μm |
| Comparative Example 1 | 0 MPa | 116 μm |
| Comparative Example 2 | −20 MPa | 189 μm |

In Examples 1 and 2, in which a larger tensile stress acts on the outer peripheral part than in the center part, the warpage of the SiC substrate with the surface layer was small, compared to Comparative Example 1 in which the tensile stress did not act on the outer peripheral part compared to the center part and Comparative Example 2 in which the compressive stress acts on the outer peripheral part. That is, in the substrate having a tensile stress in the outer peripheral part compared to the center part, the warpage of the epitaxial wafer during a semiconductor process can be reduced, compared to the SiC substrate in which the tensile stress does not act on the outer peripheral part compared to the center part and the SiC substrate in which the compressive stress acts on the outer peripheral part.

EXPLANATION OF REFERENCES

1 first outer peripheral point
2 first center point
3 second outer peripheral point
5 outer peripheral part
6 center part
10 SiC substrate
**10*a*** first surface
**10*b*** second surface
11 SiC epitaxial layer
20 SiC epitaxial wafer
hp highest point
lp lowest point
sp support point
Shp, Slp virtual plane
Sr reference plane

What is claimed is:

1. A SiC epitaxial wafer comprising:
a SiC substrate; and
a SiC epitaxial layer stacked on one surface of the SiC substrate, wherein,
a diameter of the SiC substrate is 195 mm or more,
a warp is 50 μm or less, and
a warp of the SiC substrate is 50 μm or less.

2. The SiC epitaxial wafer according to claim 1,
wherein, in a surface of the SiC epitaxial layer, in a case where supports are positioned to overlap with a circumference on 7.5 mm inside from an outermost periphery and a plane passing through parts overlapping with the supports when seen in a thickness direction is defined as a reference plane, a bow is 30 μm or less.

3. The SiC epitaxial wafer according to claim 1,
wherein, the warp is 30 μm or less.

4. The SiC epitaxial wafer according to claim 2,
wherein, in the surface of the SiC epitaxial layer, in the case where supports are positioned to overlap with the circumference on 7.5 mm inside from the outermost periphery and the plane passing through parts overlapping with the supports when seen in the thickness direction is defined as the reference plane, the bow is 10 μm or less.

5. The SiC epitaxial wafer according to claim 2,
wherein, in the surface of the SiC epitaxial layer, in the case where supports are positioned to overlap with the circumference on 7.5 mm inside from the outermost periphery and the plane passing through parts overlapping with the supports when seen in the thickness direction is defined as the reference plane, the bow is-30 μm or more.

6. The SiC epitaxial wafer according to claim 1,
wherein, a thickness of the SiC substrate is 350 μm or less.

7. A SiC epitaxial wafer comprising:
a SiC substrate; and
a SiC epitaxial layer stacked on one surface of the SiC substrate, wherein,
a diameter of the SiC substrate is 195 mm or more,
a warp of the SiC epitaxial wafer is 50 μm or less, and
a value subtracting the warp of the SiC substrate from a warp of the SiC epitaxial wafer is 0 μm or more and 78 μm or less.

8. The SiC epitaxial wafer according to claim 7,
wherein, the value subtracting the warp of the SiC substrate from the warp of the SiC epitaxial wafer is 0 μm or more and 47 μm or less.

9. A SiC epitaxial wafer comprising:
a SiC substrate; and
a SiC epitaxial layer stacked on one surface of the SiC substrate, wherein,
a diameter of the SiC substrate is 195 mm or more,
a thickness of the SiC substrate is 350 μm or less, and
a warp is 50 μm or less.

10. The SiC epitaxial wafer according to claim 7,
wherein, in a surface of the SiC epitaxial layer, in a case where supports are positioned to overlap with a circumference on 7.5 mm inside from an outermost periphery and a plane passing through parts overlapping with the supports when seen in a thickness direction is defined as a reference plane, a bow is 30 μm or less.

11. The SiC epitaxial wafer according to claim 9,
wherein, in a surface of the SiC epitaxial layer, in a case where supports are positioned to overlap with a circumference on 7.5 mm inside from an outermost periphery and a plane passing through parts overlapping with the supports when seen in a thickness direction is defined as a reference plane, a bow is 30 μm or less.

12. The SiC epitaxial wafer according to claim 10,
wherein, in the surface of the SiC epitaxial layer, in the case where supports are positioned to overlap with the circumference on 7.5 mm inside from the outermost periphery and the plane passing through parts overlapping with the supports when seen in the thickness direction is defined as the reference plane, the bow is 10 μm or less.

13. The SiC epitaxial wafer according to claim 11,
wherein, in the surface of the SiC epitaxial layer, in the case where supports are positioned to overlap with the circumference on 7.5 mm inside from the outermost periphery and the plane passing through parts overlapping with the supports when seen in the thickness direction is defined as the reference plane, the bow is 10 μm or less.

14. The SiC epitaxial wafer according to claim 10,
wherein, in the surface of the SiC epitaxial layer, in the case where supports are positioned to overlap with the circumference on 7.5 mm inside from the outermost periphery and the plane passing through parts overlapping with the supports when seen in the thickness direction is defined as the reference plane, the bow is-30 μm or more.

15. The SiC epitaxial wafer according to claim 11,
wherein, in the surface of the SiC epitaxial layer, in the case where supports are positioned to overlap with the circumference on 7.5 mm inside from the outermost periphery and the plane passing through parts overlapping with the supports when seen in the thickness direction is defined as the reference plane, the bow is-30 μm or more.

16. The SiC epitaxial wafer according to claim 9, wherein, the warp is 30 μm or less.

17. The SiC epitaxial wafer according to claim 1, wherein, the warp of the SiC substrate is 30 μm or less.

18. The SiC epitaxial wafer according to claim 6, wherein, the warp of the SiC substrate is 30 μm or less.

19. The SiC epitaxial wafer according to claim 16, wherein, a warp of the SiC substrate is 30 μm or less.

20. The SiC epitaxial wafer according to claim 19, wherein, in a surface of the SiC epitaxial layer, in the case where supports are positioned to overlap with the circumference on 7.5 mm inside from the outermost periphery and the plane passing through parts overlapping with the supports when seen in the thickness direction is defined as the reference plane, a bow is −30 μm or more and 10 μm or less.

* * * * *